United States Patent [19]

Uehara et al.

[11] Patent Number: 5,709,519

[45] Date of Patent: Jan. 20, 1998

[54] PLASMA PROCESSING APPARATUS

[75] Inventors: Akira Uehara; Mitsuaki Minato; Yoshitsugu Kawamura, all of Kanagawa, Japan

[73] Assignee: Tokyo Ohka Kogyo Co., Ltd., Kanagawa, Japan

[21] Appl. No.: 7,522

[22] Filed: Jan. 22, 1993

[30] Foreign Application Priority Data

Jan. 22, 1992 [JP] Japan .................................. 4-031453

[51] Int. Cl.⁶ .................................................. B65G 65/00
[52] U.S. Cl. .................. 414/416; 104/36; 414/744.5; 414/937; 414/940
[58] Field of Search .................... 414/935, 936, 414/937, 939, 940, 941, 744.4, 217, 744.5, 222, 744.6, 225, 226, 754, 331; 104/35, 36, 47

[56] References Cited

U.S. PATENT DOCUMENTS

| | | | |
|---|---|---|---|
| 1,253,864 | 1/1918 | Miura | 104/36 |
| 1,379,239 | 5/1921 | Barwicki | 104/36 |
| 4,550,239 | 10/1985 | Uehara et al. | 414/940 X |
| 4,770,590 | 9/1988 | Hugues et al. | 414/936 X |
| 4,781,511 | 11/1988 | Harada et al. | 414/940 X |
| 4,923,054 | 5/1990 | Ohtani et al. | 414/941 X |
| 5,048,164 | 9/1991 | Harima | 414/940 X |
| 5,162,047 | 11/1992 | Wade et al. | 414/416 X |

FOREIGN PATENT DOCUMENTS

| | | | |
|---|---|---|---|
| 217938 | 8/1989 | Japan | 414/940 |
| 276261 | 11/1990 | Japan | 414/416 |

*Primary Examiner*—Frank E. Werner
*Attorney, Agent, or Firm*—Weiner, Carrier, Burt & Esser, P.C.; Joseph P. Carrier; Irving M. Weiner

[57] ABSTRACT

A plasma processing apparatus for etching, ashing, or otherwise processing silicon wafers has a pair of spaced reaction chambers each for processing a silicon wafers in a plasma, a pair of spaced cassette table mechanisms each for supporting a wafer cassette which houses a plurality of wafers therein, and a transfer robot disposed between the pair of spaced reaction chambers and the pair of spaced cassette table mechanisms, for transferring the wafers, one at a time, between the wafer cassette supported by one of the workpiece table mechanisms and one of the reaction chambers. Each of the cassette table mechanisms has a turntable for placing the wafer thereon, the turntable being rotatable to orient the wafer cassette out of physical interference with the robot arm of the transfer robot.

23 Claims, 6 Drawing Sheets

PLASMA PROCESSING APPARATUS

BACKGROUND OF THE INVENTION

1. Field of the Invention

The present invention relates to a plasma processing apparatus having a transfer robot for transferring a wafer or wafers between a wafer cassette on a wafer table mechanism and a wafer holder below a reaction chamber.

2. Description of the Relevant Art

There are known plasma processing apparatus for etching, ashing, or otherwise processing silicon wafer surfaces. In some known plasma processing apparatus, a wafer cassette that holds a number of vertically spaced unprocessed silicon wafers is fed from a standby position along a feed line to a transfer position, from which the wafer cassette is transferred to a cassette table. The silicon wafers are then transferred, one or more at a time, from the wafer cassette fixed to the cassette table to a wafer holder. The wafer holder which stores the silicon wafers is thereafter introduced into a reaction chamber for processing.

The silicon wafers are transferred from the fixed wafer cassette to the wafer holder by a robot arm. More specifically, the robot arm is extended to a position in which the lowermost silicon wafer in the wafer cassette is placed on a robot hand, and then contracted away from the wafer cassette and turned horizontally through a predetermined angle of 180°. Thereafter, the robot arm is extended to insert the robot hand into the wafer holder for transferring the silicon wafer to the wafer holder. After having transferred the silicon wafer, the robot arm is contracted again, horizontally turned back 180°, elevated a distance corresponding to the pitch of the silicon wafers in the wafer cassette, into horizontal alignment with the next silicon wafer and extended to allow the robot hand to carry the next silicon wafer. The above process is repeated until all the silicon wafers are transferred from the wafer cassette to the wafer holder.

The wafer cassette, which is in the form of a unitary channel-shaped body molded of plastic, comprises a bottom plate and a pair of parallel spaced side plates extending from opposite side edges of the bottom plate. The side plates have grooves defined in their inner confronting surfaces for receiving peripheral edges of the silicon wafers.

In the conventional plasma processing apparatus, the reaction chamber is often positioned out of alignment with the side plates of the wafer cassette that is fixedly mounted on the cassette table. Particularly, in a plasma processing apparatus with two reaction chambers, the reaction chambers are not aligned with the sides plates of the wafer cassette on the cassette table.

When the robot hand is inserted into the wafer cassette on the cassette table, the robot hand should be moved out of physical interference with the side plates of the wafer cassette on the cassette table. As a result, the motion of the robot arm as it transfers the silicon wafer from the wafer cassette to the robot hand, and the motion of the robot arm as it transfers the silicon wafer between the robot hand and the wafer holder are not symmetrical. Consequently, the robot is required to be highly complex in structure and control, and the time needed to transfer the silicon wafer is relatively lengthy.

The above problem may be solved by orienting the wafer cassette toward the reaction chamber when the feed line is redirected or the wafer cassette is set on the feed line. However, this solution is ineffective if the plasma processing apparatus has two reaction chambers.

SUMMARY OF THE INVENTION

It is an object of the present invention to provide a plasma processing apparatus having a transfer robot capable of smoothly and quickly transferring a workpiece, such as a silicon wafer, between a cassette on a table mechanism and a holder below a reaction chamber.

According to the present invention, there is provided a plasma processing apparatus comprising a feed line for feeding a cassette which houses a wafer therein, a cassette table mechanism for receiving the cassette from the feed line and transferring the cassette to the feed line, a reaction chamber for processing the wafer in a plasma, and a transfer robot having an extensible and contractable robot arm for transferring the wafer between the reaction chamber and the cassette received by the cassette table mechanism, the cassette table mechanism having a turntable for supporting the cassette thereon, the turntable being angularly movable between a position substantially perpendicular to the feed line and a position oriented toward the reaction chamber.

According to the present invention, there is also provided a plasma processing apparatus comprising a reaction chamber for processing a workpiece in a plasma, a workpiece table mechanism for supporting a cassette which houses a workpiece therein, and a transfer robot disposed between the reaction chamber and the workpiece table mechanism for transferring the workpiece between the cassette supported by the workpiece table mechanism and the reaction chamber, the workpiece table mechanism having a turntable for placing the workpiece thereon, the turntable being rotatable to orient the cassette out of physical interference with the transfer robot.

According to the present invention, there is further provided a plasma processing apparatus comprising a pair of spaced reaction chambers each for processing a workpiece in a plasma, a pair of spaced workpiece table mechanisms each for supporting a cassette which houses a workpiece therein, and a transfer robot disposed between the pair of spaced reaction chambers and the pair of spaced workpiece table mechanisms, for transferring the workpiece between the cassette supported by one of the workpiece table mechanisms and one of the reaction chambers, each of the workpiece table mechanisms having a turntable for placing the workpiece thereon, the turntable being rotatable to orient the cassette out of physical interference with the transfer robot.

The above and further objects, details and advantages of the present invention will become apparent from the following detailed description of a preferred embodiment thereof, when read in conjunction with the accompanying drawings.

DETAILED DESCRIPTION OF THE PREFERRED EMBODIMENT

Figure 1:
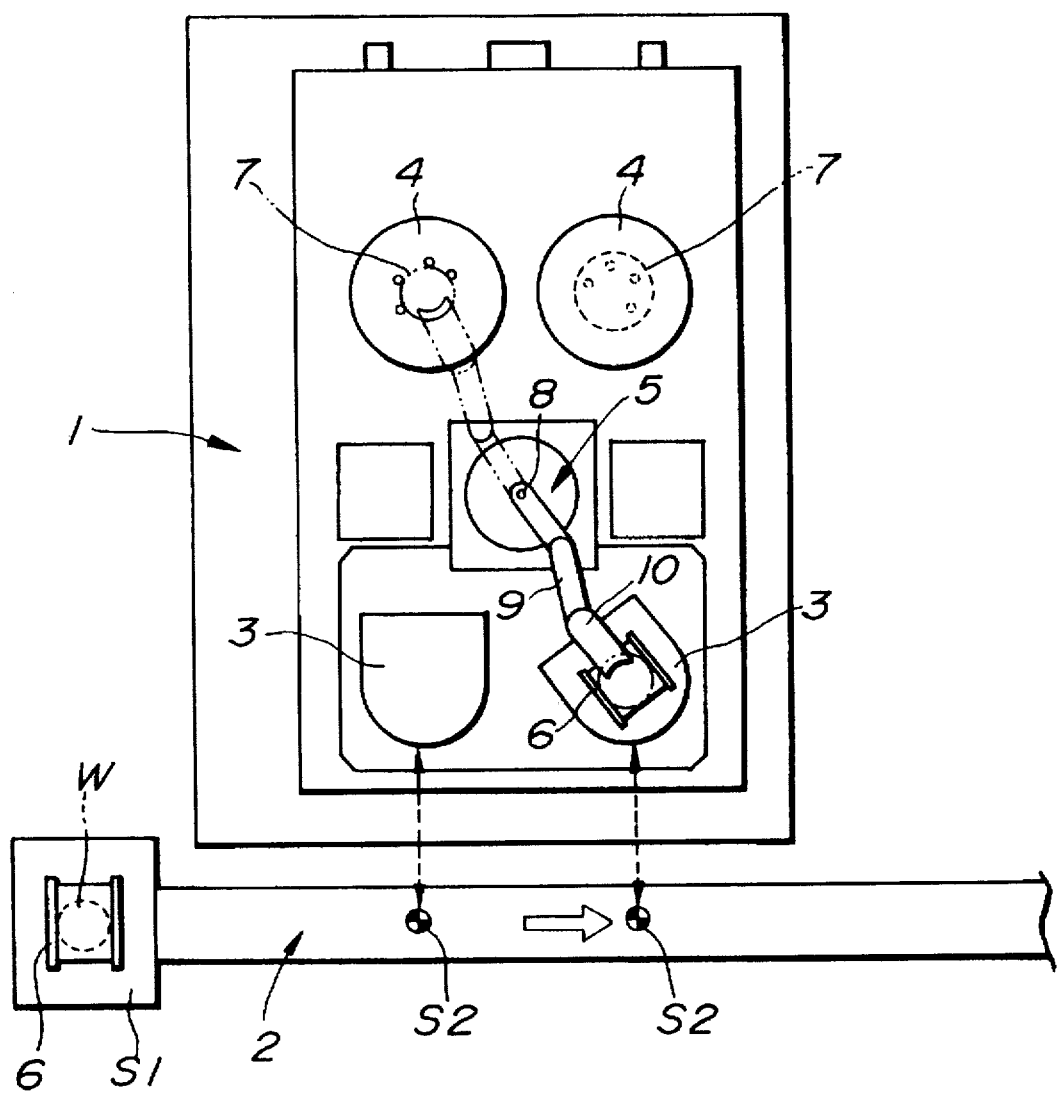
FIG. 1 is a plan view of a plasma processing apparatus according to the present invention.

As shown in FIG. 1, a plasma processing apparatus according to the present invention has a processing station 1 and a feed line 2 such as a conveyor belt or the like positioned alongside of the processing station 1. The processing station 1 comprises two cassette table mechanisms 3 that are spaced from each other along the feed line 2, two reaction chambers 4 that are aligned with the respective cassette table mechanisms 3 in a direction normal to the feed line 2, and a transfer robot 5 positioned intermediate between the cassette table mechanisms 3 and the reaction chambers 4.

The feed line 2 serves to feed a wafer cassette 6 holding a number of unprocessed silicon wafers W from a standby station S1 to one of two spaced transfer positions S2 on the feed line 2. The transfer positions S2 are aligned with the respective cassette table mechanisms 3 in the direction normal to the feed line 2. The wafer cassette 6 moved to one of the transfer positions S2 is transferred therefrom to a corresponding one of the cassette table mechanisms 3 by a suitable transfer mechanism (not shown). A wafer cassette 6 with processed wafers W is subsequently transferred back from one of the cassette table mechanisms 3 to a corresponding one of the transfer positions S2 by the transfer mechanism.

Figure 5:
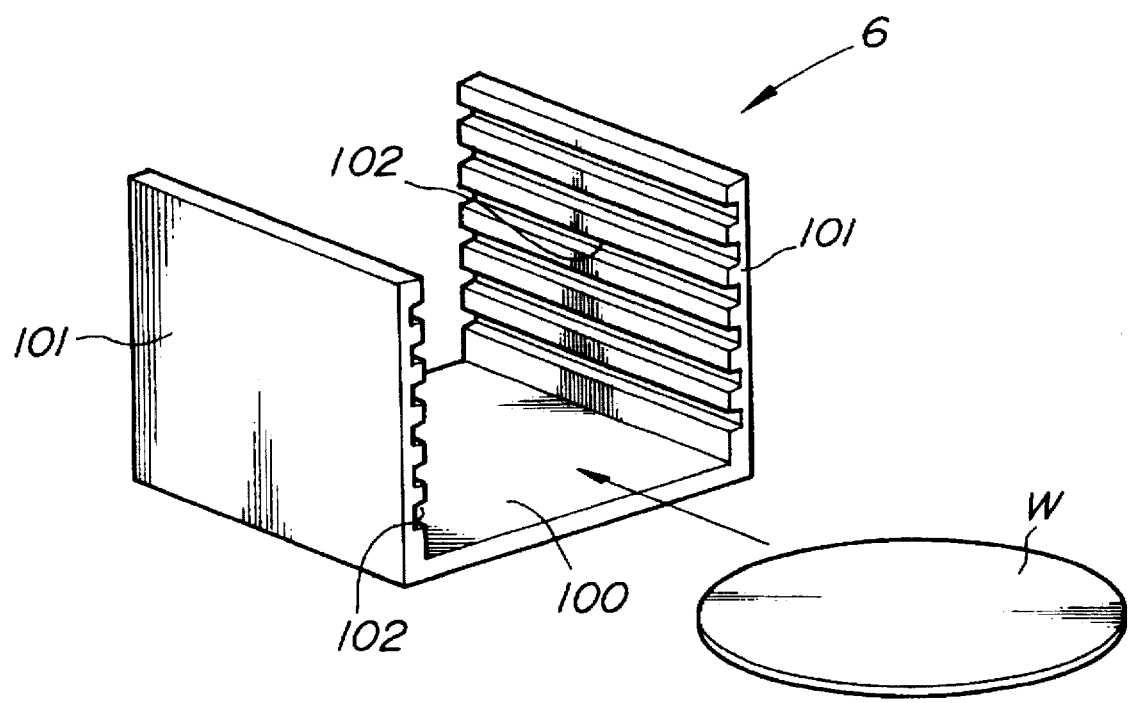
FIG. 5 is a perspective view of a cassette for use in the plasma processing apparatus.

As shown in FIG. 5, the wafer cassette 6 is in the form of a unitary channel-shaped body molded of plastic. More specifically, the wafer cassette 6 comprises a bottom plate 100 and a pair of parallel spaced side plates 101 extending from opposite side edges of the bottom plate 100. The side plates 101 have grooves 102 defined in their inner confronting surfaces for receiving peripheral edges of the silicon wafers W.

Figure 6:
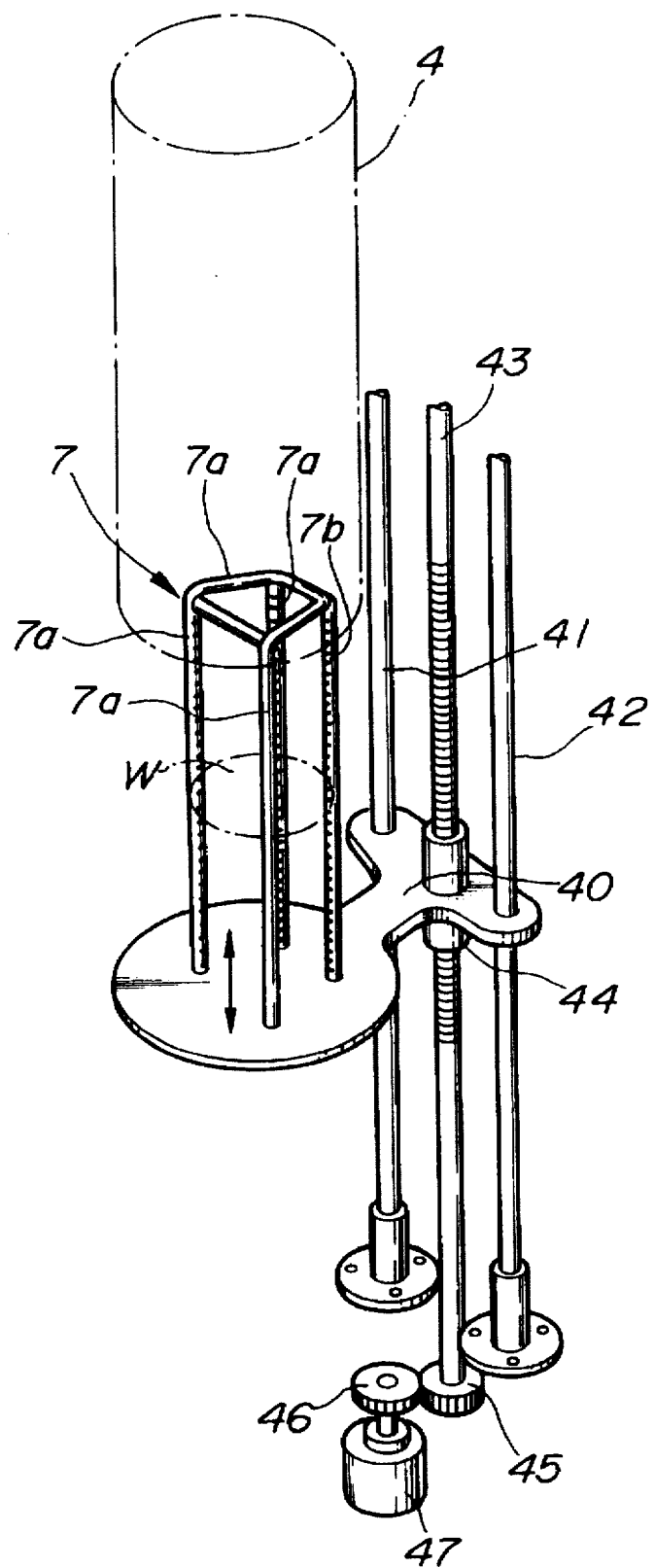
FIG. 6 is a perspective view of a wafer holder and a reaction chamber.

As shown in FIG. 6, each of the reaction chambers 4 is in the form of a hollow cylinder made of quartz, and has a closed upper end and an open lower end.

Two wafer holders 7 are vertically movably positioned below the respective though only one is shown in FIG. 6 reaction chambers 4, respectively. Each of the wafer holders 7 comprises four horizontally spaced support columns or rods 7a each made of quartz supported on a lid member 40. Each of the support columns 7a has a number of grooves 7b defined in an inner side thereof for receiving peripheral edges of the silicon wafers W. Two fixed guide bars 41, 42 which extend vertically through the lid member 40 are disposed one on each side of a screw shaft 43 that is threaded through a sleeve 44 attached to the lid member 40. The screw shaft 43 has a gear 45 fixed to a lower end thereof and held in mesh with a gear 46 mounted on the output shaft of a motor 47. When the motor 47 is energized, the guide sleeve 44 and hence the lid member 40 move vertically, moving the wafer holder 7 vertically into and out of the reaction chamber 4. When the wafer holders 7 are lowered to their lowermost position, they are positioned below and out of the respective reaction chambers 4. When the wafer holders 7 are lifted to their uppermost position, they enter the respective reaction chambers 4 and closes the open lower ends thereof.

The transfer robot 5 has a vertical shaft 8 and an articulated robot arm 9 coupled at one end to the vertical shaft 8 for movement in a horizontal plane. The transfer robot 5 also has a robot hand 10 on the opposite end of the robot arm 9 for placing a silicon wafer W thereon. The vertical shaft 8 is positioned at the center of a hypothetical rectangular shape with the cassette table mechanisms 3 and the wafer holder 7 being located at the respective vertices of the hypothetical rectangular shape.

Figure 3:
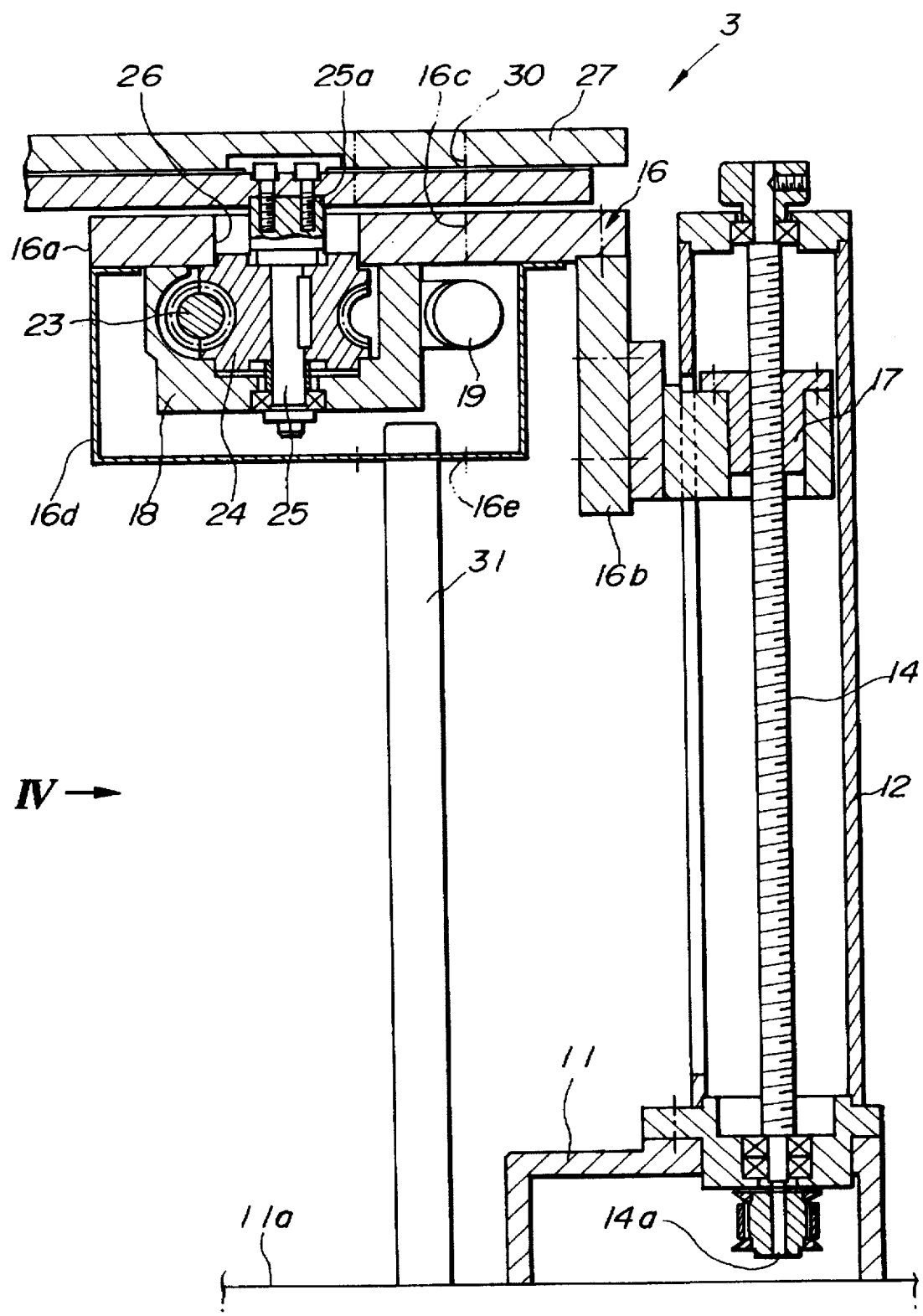
FIG. 3 is a cross-sectional view taken along line III—III of FIG. 2.
Figure 4:
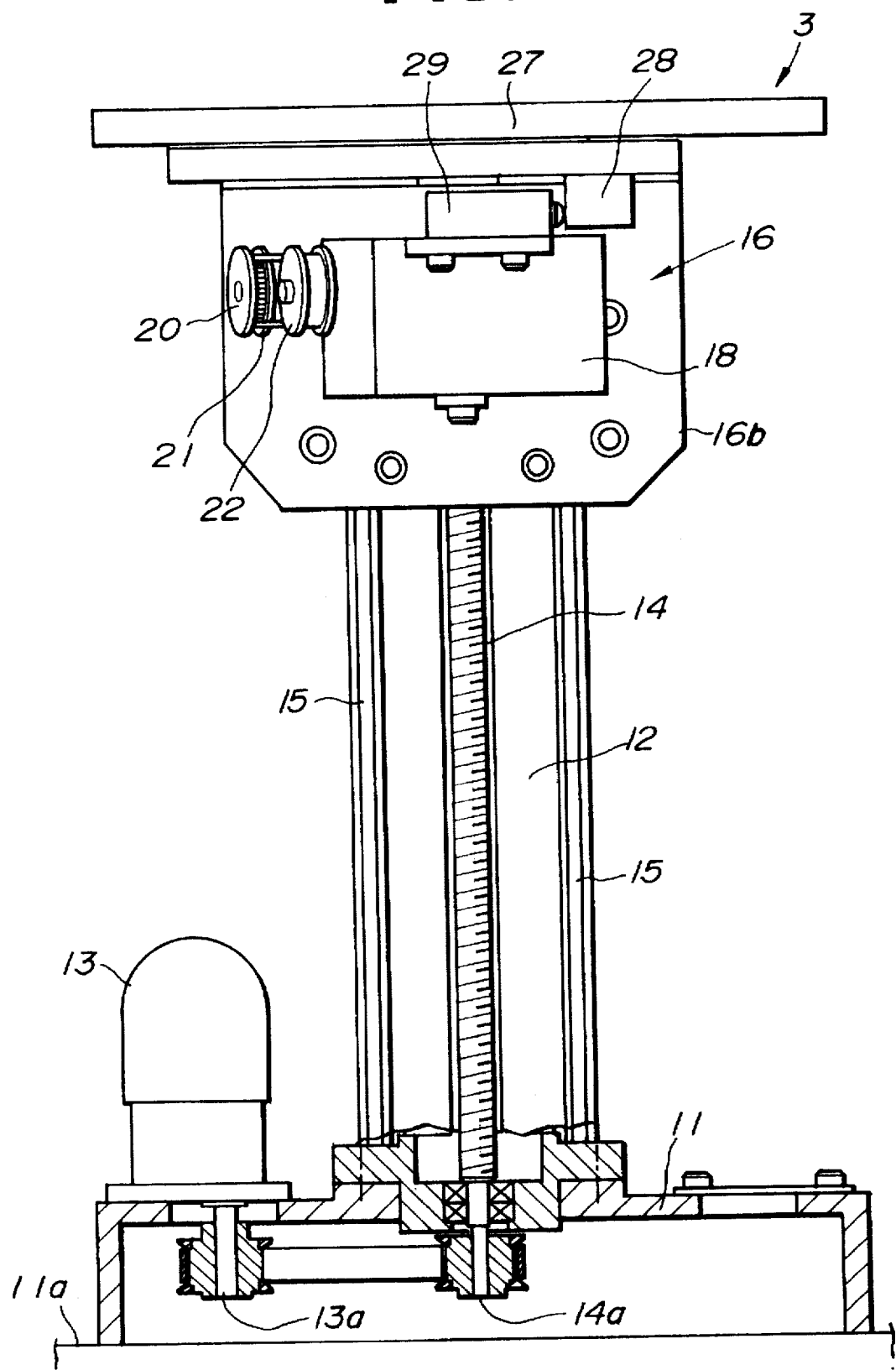
FIG. 4 is a side elevational view of the cassette table mechanism as viewed in the direction indicated by the arrow IV in FIG. 3.

Each of the cassette table mechanisms 3 will be described in detail below with reference to FIGS. 2 through 4.

The cassette table mechanism 3 has a horizontal base 11 fixedly mounted on a foundation 11a, a vertical hollow support column 12 mounted on the base 11, a vertical screw shaft 14 rotatably disposed in and extending through the vertical hollow support column 12, and a vertically movable angle 16 slidably engaging rails 15 attached to opposite side walls of the vertical hollow support column 12. The vertically movable angle 16 comprises a horizontal panel 16a and a vertical panel 16b joined at its upper edge to one side edge of the horizontal panel 16a. The vertical panel 16b is connected to a nut 17 threaded over the screw shaft 14. The screw shaft 14 has a lower end 14a projecting into the base 11 and operatively coupled through a belt-and-pulley mechanism to the output shaft 13a of a motor 13 mounted on the base 11. Therefore, when the screw shaft 14 is rotated by the motor 13, the vertically movable angle 16 moves upwardly or downwardly along the vertical hollow support column 12.

The cassette table mechanism 3 also has a gearbox 18 fixed to the lower surface of the horizontal panel 16a, and a motor 19 fixed to an outer wall surface of the gearbox 18. Rotation of the output shaft of the motor 19 is transmitted through a drive pulley 20, a timing belt 21, and a driven belt 22 to a worm 23 that is disposed within the gearbox 18 and held in mesh with a worm gear 24. The worm gear 24 is fixedly mounted on a vertical shaft 25 with its lower end rotatably supported on the gearbox 18. Accordingly, when the motor 19 is energized, the vertical shaft 25 is rotated about is own axis.

The vertical shaft 25 has an upper end 25a projecting upwardly through an opening 26 defined in the horizontal panel 16a. A horizontal turntable 27 for placing a wafer cassette 6 placed thereon is fastened to the projecting upper end 25a by screws for rotation with the vertical shaft 25. The turntable 27 has on its lower surface a stopper 28 projecting downwardly. When the turntable 27 is not turned in a horizontal plane by the motor 19, its axis is directed substantially perpendicularly to the feed line 2, i.e., its front straight edge 27a extends parallel to the feed line 2. When the turntable 27 is turned a certain angle by the motor 19, the stopper 28 finally engages a limit switch 29 (see FIG. 2) secured to the horizontal panel 16a, triggering the limit switch 29 to de-energize the motor 19 to stop the angular movement of the turntable 27. With the turntable 27 thus stopped, the front straight edge 27a of the turntable 27 faces toward one of the reaction chambers 4 as shown in FIG. 1.

Figure 2:
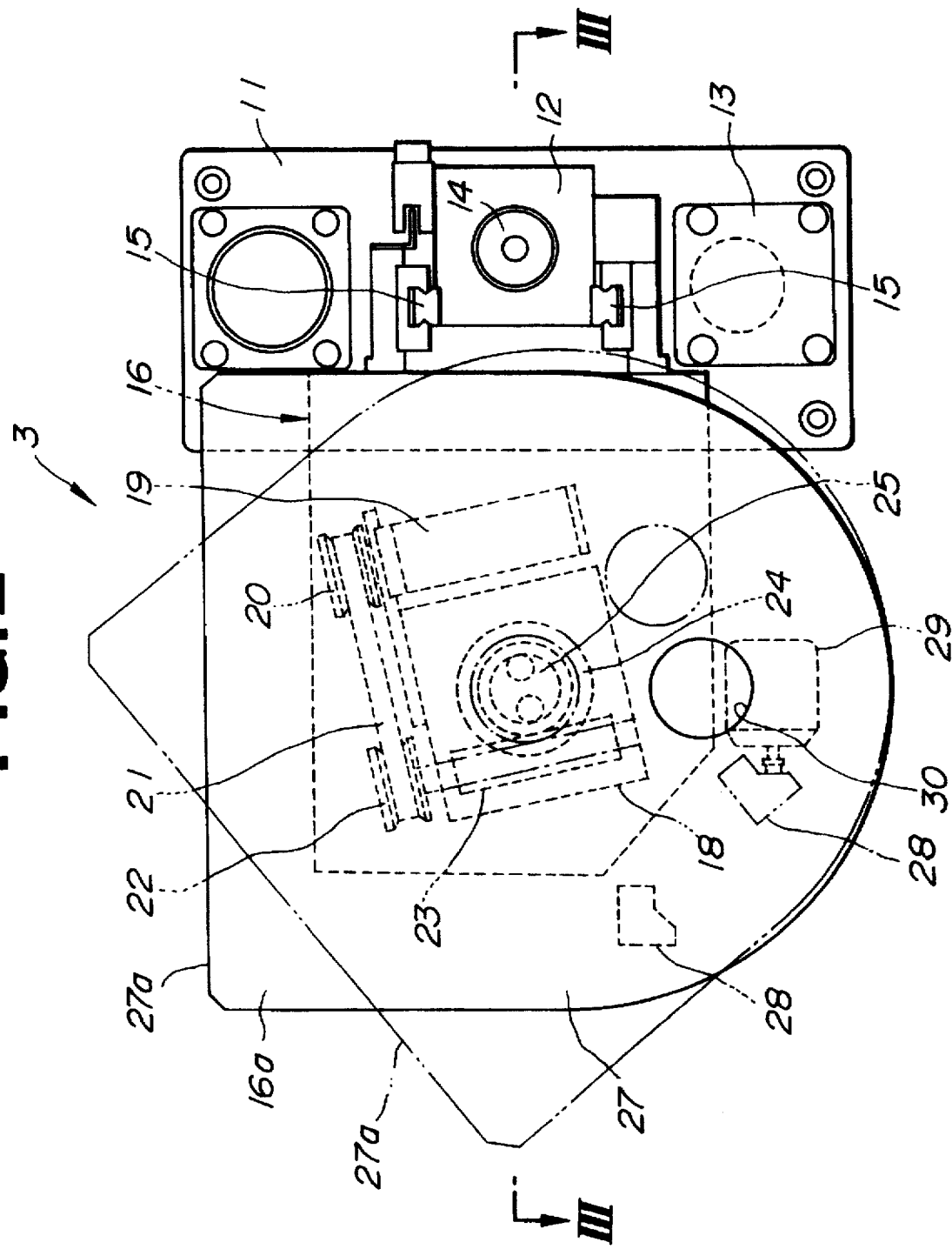
FIG. 2 is an enlarged plan view of a cassette table mechanism for supporting a wafer cassette, of the plasma processing apparatus.

The turntable 27 has a circular opening 30 defined therein as shown in FIG. 2. As shown in FIG. 3, the horizontal panel 16a has an opening 16c defined therein in vertical registry with the circular opening 30. The gearbox 18 is covered with a cover 16d attached to the lower surface of the horizontal panel 16a and having an opening 16e defined therein in vertical registry with the opening 16c. A vertically elongate sensor 31 (see FIG. 3) is supported on the foundation 11a for detecting whether there are any silicon wafers W remaining in the wafer cassette 6 supported on the turntable 27. When the cassette table mechanism 3 is lowered by the screw shaft 14 driven by the motor 13, the sensor 31 extends through the openings 16e, 16c, 30 and has its upper end portion projecting above the turntable 27 to detect whether there are any silicon wafers W remaining in the wafer cassette 6.

Operation of the plasma processing apparatus will be described below.

A wafer cassette 6 with a plurality of unprocessed silicon wafers W stored therein is fed from the standby position S1 to one of the transfer positions S2 along the feed line 2. When the wafer cassette 6 reaches the transfer position S2, the wafer cassette 6 is transferred therefrom onto the turntable 27 of the corresponding cassette table mechanism 3 by the unshown transfer mechanism. After the wafer cassette 6 is placed on the turntable 27, the motor 19 is energized to turn the turntable 27 until its front straight edge 27a faces diagonally toward one of the wafer holders 4 across the transfer robot 5, more precisely, its vertical shaft 8 such that the shaft 8 is positioned between extension of the side plates 101 of the wafer cassette 6. With the turntable 27 thus oriented, the side plates 101 of the wafer cassette 6 are aligned with the reaction chamber 4 across the robot 5. Corresponding, when the articulated robot arm 9 is extended and contracted, therefore, it will not physically interfere with the side plates 101 of the wafer cassette 6 on the turntable 27.

Continuing the operation the robot arm 9 is then extended into the wafer cassette 6 on the turntable 27, and the lowermost silicon wafer W in the wafer cassette 6 is placed on the robot hand 10. The robot arm 9 is contracted and then horizontally turned 180° until it is directed toward the diagonally positioned reaction chamber 4. The robot arm 9 is extended again to insert the robot hand 10 with the silicon wafer W placed thereon into the wafer holder 7 which has been lowered below the reaction chamber 4, and transfers the silicon wafer W from the robot hand 10 into the wafer holder 7. The robot arm 9 is then contracted to retract the robot hand 10 out of the wafer holder 7, turned 180°, and elevated a distance corresponding to the pitch of the silicon wafers W stored in the wafer cassette 6. Thereafter, the above process is repeated again and again until all the silicon wafers W are transferred from the wafer cassette 6 to the wafer holder 7. The wafer holder 7 in which the silicon wafers W are held is then elevated into the reaction chamber 4 until it closes the open lower end of the reaction chamber 4. Thereafter, the reaction chamber 4 is evacuated and a plasma is generated therein to process, e.g., etch or ash, the silicon wafers W supported in the wafer holder 7. After the silicon wafers W have been processed, the wafer holder 7 is lowered out of the reaction chamber 4, and the silicon wafers W are transferred one by one from the wafer holder 7 back to the wafer cassette 6 by the robot arm 9 in a process which is a reversal of the above transferring process. The wafer cassette 6 which holds the processed silicon wafers W is thereafter returned from the cassette table mechanism 3 back to the feed line 2, which is then actuated to feed the wafer cassette 6 to a next processing station.

Inasmuch as the turntable 27 of the cassette table mechanism 3 can be horizontally turned, the side plates 101 of the wafer cassette 6 can be directed in alignment with the reaction chamber 4 across the vertical shaft 8 of the transfer robot 5. Therefore, the robot arm 9 can be extended and contracted out of physical interference with the side plates 101. Since the motion of the robot arm 9 to transfer the silicon wafer W between the robot hand 10 and the wafer cassette 6, and the motion of the robot arm 9 to transfer the silicon wafer W between the robot hand 10 and the wafer holder 7 are symmetrical, the robot 5 may be relatively simple in structure and control. The plasma processing apparatus according to the present invention may therefore be relatively simple, low in cost, and can transfer the silicon wafer W in a relatively short period of time.

In the illustrated embodiment, the wafer W is transferred from one of the cassette table mechanisms 3 to a diagonally opposite one of the reaction chambers 4, and hence the robot arm 9 is turned 180° in doing so. However, the wafer W may be transferred from one of the cassette table mechanisms 3, e.g., the righthand cassette table mechanism 3 in FIG. 1, to a confronting one of the reaction chambers 4, e.g., the righthand reaction chamber 4 in FIG. 1 by the transfer robot 5. In this case, the turntable 27 of the righthand cassette table mechanism 3 is also turned through the same angle as when the silicon wafer W would be transferred to the diagonally opposite, or lefthand, reaction chamber 4. Therefore, the robot arm 9 may be extended and contracted to the same extent because the reaction chambers 4 would still be disposed symmetrically across from the wafer cassettes 6 on opposite sides of the robot 5 and the vertical shaft 8 of the robot 5 would still be disposed between extensions of the side plates 101 of the cassettes, but horizontally turned through an angle smaller than 180° until it is oriented toward the righthand reaction chamber 4. Consequently, irrespective of whether the silicon wafer W is to be transferred from one of the cassette table mechanisms 3 to the lefthand or righthand reaction chamber 4, the robot arm 9 can be controlled relatively simply for the transfer of the silicon wafer W.

Although there has been described what is at present considered to be the preferred embodiment of the invention, it will be understood that the invention may be embodied in other specific forms without departing from the essential characteristics thereof. The present embodiment is therefore to be considered in all respects as illustrative, and not restrictive. The scope of the invention is indicated by the appended claims rather than by the foregoing description.

What is claimed is:

1. A plasma processing apparatus comprising:
   a feed line for feeding a cassette which houses a wafer therein;
   a cassette table mechanism disposed near said feed line for receiving the cassette
   in operative cooperation with said feed line;
   a reaction chamber means for processing the wafer in plasma; and
   a transfer robot means including an extensible and contractible robot arm for transferring the wafer between said reaction chamber means and said cassette as received by said cassette table mechanism;
   said cassette table mechanism having means for supporting the cassette thereon, and means for angularly moving the cassette between a position substantially perpendicular to said feed line and a position oriented toward said reaction chamber means; and
   said reaction chamber means includes a reaction chamber which is disposed substantially symmetrically across from said cassette on opposite sides of said transfer robot means when said cassette is supported by said cassette table mechanism.

2. A plasma processing apparatus according to claim 1, further comprising means for vertically moving said cassette table mechanism.

3. A plasma processing apparatus according to claim 1, wherein said transfer robot means further has a vertical shaft to which said one end of said robot arm is connected for movement in a horizontal plane, and said robot arm comprises an articulated robot arm.

4. A plasma processing apparatus according to claim 3, wherein said transfer robot means has a robot hand mounted on an end of said robot arm for carrying the wafer thereon.

5. A plasma processing apparatus according to claim 3, wherein said cassette has a pair of spaced side plates and said vertical shaft of said transfer robot means is positioned between extensions of said side plates when said cassette is moved to said position oriented toward said reaction chamber.

6. A plasma processing apparatus according to claim 1, wherein said reaction chamber means further comprises a wafer holder vertically movable into and out of an open end of said reaction chamber.

7. A plasma processing apparatus according to claim 6, wherein said wafer holder comprises a plurality of spaced support columns each having a plurality of grooves defined in a side thereof for receiving a peripheral edge of the wafer.

8. A plasma processing apparatus according to claim 6, wherein said wafer holder is adapted to close said open end of said reaction chamber when the wafer holder is moved upwardly into said reaction chamber.

9. A plasma processing apparatus according to claim 1, wherein said angularly moving means includes a turntable having an opening defined therein, said apparatus further comprising a sensor movable through said opening for detecting whether there is a wafer remaining in the cassette supported on said turntable.

10. A plasma processing apparatus according to claim 1, wherein said supporting means comprises a turntable.

11. A plasma processing apparatus comprising:
a reaction chamber means for processing a workpiece in a plasma;
a workpiece table mechanism for supporting a cassette which houses a workpiece therein; and
a transfer robot means disposed between said reaction chamber means and said workpiece table mechanism for transferring the workpiece between the cassette supported by said workpiece table mechanism and said reaction chamber means;
said workpiece table mechanism having a surface for receiving the cassette thereon, and means for moving said surface to orient the cassette out of physical interference with said transfer robot means;
said reaction chamber means including a reaction chamber which is disposed symmetrically across from said cassette on opposite sides of said transfer robot means when the cassette is supported by said workpiece table mechanism.

12. A plasma processing apparatus according to claim 11, wherein said workpiece table mechanism has a horizontal panel, and said moving means comprises a gearbox fixed to said horizontal panel, an actuator attached to said gearbox, a shaft rotatably supported on said gearbox and connected to said surface, and gear means disposed in said gearbox for transmitting rotation from said actuator to said shaft.

13. A plasma processing apparatus according to claim 12, wherein said workpiece table mechanism has a stopper attached to said surface, and a limit switch secured to said horizontal panel, said limit switch being triggerable by said stopper for de-energizing said actuator when said surface has rotated through a predetermined angular interval.

14. A plasma processing apparatus according to claim 11, further comprising feed means for feeding a cassette which houses a workpiece therein to a position near said workpiece table mechanism for transfer thereto.

15. A plasma processing apparatus according to claim 11, further comprising a sensor on said surface for detecting whether there is a workpiece housed in the cassette supported by said workpiece table mechanism.

16. A plasma processing apparatus according to claim 11, wherein said workpiece table mechanism includes a turntable, and said cassette receiving surface is an upper surface of said turntable.

17. A plasma processing apparatus according to claim 11, wherein said transfer robot means includes an extensible and contractible articulated arm for transferring the wafer between said reaction chamber and said cassette supported by said workpiece table mechanism, and includes a vertical shaft having one end of said articulated arm connected thereto for movement in a horizontal plane, said cassette has a pair of spaced side plates, and said vertical shaft of the transfer robot means is positioned between extensions of the side plates of said cassette when the cassette is oriented out of physical interference with said transfer robot means by said workpiece table mechanism.

18. A plasma processing apparatus comprising:
reaction chamber means including a pair of spaced reaction chambers each for processing a workpiece in a plasma;
a pair of spaced workpiece table mechanisms each for supporting a cassette which houses a workpiece therein; and
a transfer robot means disposed between said pair of spaced reaction chambers and said pair of spaced workpiece table mechanisms, for transferring the workpiece between the cassette supported by one of said workpiece table mechanisms and one of said reaction chambers;
each of said workpiece table mechanisms having a turntable for placing the cassette thereon, said turntable being rotatable to orient the cassette out of physical interference with said transfer robot means; and
said spaced reaction chambers being disposed symmetrically across from said spaced workpiece table mechanisms on opposite sides of said transfer robot means.

19. A plasma processing apparatus according to claim 18, wherein each of said workpiece table mechanisms has a horizontal panel, a gearbox fixed to said horizontal panel, an actuator attached to said gearbox, a shaft rotatably supported on said gearbox and connected to said turntable, and gear means disposed in said gearbox for transmitting rotation from said actuator to said shaft.

20. A plasma processing apparatus according to claim 19, wherein each of said workpiece table mechanisms has a stopper attached to said turntable, and a limit switch secured to said horizontal panel, said limit switch being triggerable by said stopper for de-energizing said actuator when said turntable has rotated through a predetermined angular interval.

21. A plasma processing apparatus according to claim 18, further comprising feed means for feeding a cassette which houses a workpiece therein to a position near one of said workpiece table mechanisms for transfer thereto; and said transfer robot means is disposed at a central portion of a substantially rectangular area and said pair of spaced reaction chambers and said pair of workpiece table mechanisms are disposed at the four corners of the rectangular area, respectively.

22. A plasma processing apparatus according to claim 18, further comprising a sensor on said turntable for detecting whether there is a workpiece housed in the cassette supported by said workpiece table mechanism.

23. A plasma processing apparatus according to claim 18, wherein said transfer robot means includes an extensible and contractible robot arm for transferring workpieces between said pair of spaced reaction chambers and cassettes supported on said pair of spaced 4 workpiece table mechanisms, and includes a vertical shaft having one end of said robot arm connected thereto for movement in a horizontal plane, each said cassette has a pair of spaced side walls, and said vertical shaft is positioned between the extensions of the side plates of each said cassette when the cassette is oriented out of physical interference with said transfer robot means by said workpiece table mechanisms.

* * * * *

UNITED STATES PATENT AND TRADEMARK OFFICE
CERTIFICATE OF CORRECTION

PATENT NO.   :   5,709,519
DATED        :   20 January 1998
INVENTOR(S)  :   Akira Uehara, Mitsuaki Minato, Yoshitsugu Kawamura It is certified that error appears in the above-identified patent and that said Letters Patent is hereby corrected as shown below:

On the cover page, under "References Cited", change "Wade et al." to
    --Wada et al.--.
Column 3, line 40, delete "though only one is shown in FIG. 6";
    line 41, after "respectively" insert --though only one is shown in FIG. 6--;
    line 59, change "closes" to --close--;
    line 67, change "holder" to --holders--.
Column 5, line numbered between 11 & 12, change "extension" to
    --extensions--;
    line numbered between 15 & 16, change "Corresponding" to
    --Correspondingly--;
    line numbered between 19 & 20, after "operation" insert a comma.
Column 9, line 1, delete "4".

Signed and Sealed this

Fourteenth Day of April, 1998

Attest:

BRUCE LEHMAN

Attesting Officer

Commissioner of Patents and Trademarks